US008198161B2

(12) United States Patent
Cha

(10) Patent No.: US 8,198,161 B2
(45) Date of Patent: Jun. 12, 2012

(54) VERTICAL TRANSISTOR AND METHOD FOR FORMING THE SAME

(75) Inventor: Seon Yong Cha, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 13/251,420

(22) Filed: Oct. 3, 2011

(65) Prior Publication Data

US 2012/0021576 A1 Jan. 26, 2012

Related U.S. Application Data

(62) Division of application No. 11/953,917, filed on Dec. 11, 2007, now Pat. No. 8,053,817.

(30) Foreign Application Priority Data

Nov. 5, 2007 (KR) .................. 10-2007-0112204

(51) Int. Cl.
*H01L 21/336* (2006.01)
(52) U.S. Cl. ...................................... 438/269; 438/268
(58) Field of Classification Search .................. 438/268, 438/269
See application file for complete search history.

(56) References Cited

U.S. PATENT DOCUMENTS

| 7,078,280 | B2 * | 7/2006 | Chaudhry et al. ............. 438/156 |
| 2001/0017384 | A1 * | 8/2001 | Economikos et al. ........ 257/302 |
| 2002/0177265 | A1 * | 11/2002 | Skotnicki et al. ............. 438/200 |
| 2005/0001257 | A1 * | 1/2005 | Schloesser et al. ........... 257/302 |
| 2007/0012994 | A1 * | 1/2007 | Chou et al. ..................... 257/327 |

FOREIGN PATENT DOCUMENTS

| CN | 1385905 A | 12/2002 |
| KR | 19967004357 A | 8/1996 |
| KR | 100431709 B1 | 5/2004 |
| KR | 100660881 B1 | 12/2006 |
| KR | 100723527 B1 | 5/2007 |
| WO | 95/03625 A1 | 2/1995 |

OTHER PUBLICATIONS

USPTO RR mailed Mar. 9, 2009 in connection with U.S. Appl. No. 11/953,917.
USPTO NFOA mailed Apr. 10, 2009 in connection with U.S. Appl. No. 11/953,917.
USPTO FOA mailed Nov. 20, 2009 in connection with U.S. Appl. No. 11/953,917.
USPTO NFOA mailed Feb. 28, 2011 in connection with U.S. Appl. No. 11/953,917.
USPTO NOA mailed Aug. 18, 2011 in connection with U.S. Appl. No. 11/953,917.

* cited by examiner

*Primary Examiner* — Zandra Smith
*Assistant Examiner* — Jamie C Niesz
(74) *Attorney, Agent, or Firm* — Ladas & Parry LLP

(57) ABSTRACT

A vertical transistor and a method for forming the same. The vertical transistor includes a semiconductor substrate having pillar type active patterns formed on a surface thereof; first junction regions formed in the surface of the semiconductor substrate on both sides of the active patterns; screening layers formed on sidewalls of the first junction regions; second junction regions formed on upper surfaces of the active patterns; and gates formed on sidewalls of the active patterns including the second junction regions to overlap with at least portions of the first junction regions.

18 Claims, 9 Drawing Sheets

VERTICAL TRANSISTOR AND METHOD FOR FORMING THE SAME

CROSS-REFERENCE TO RELATED APPLICATIONS

The present application claims priority to Korean patent application number 10-2007-0112204 filed on Nov. 5, 2007, which is incorporated herein by reference in its entirety.

BACKGROUND OF THE INVENTION

The present invention relates to a vertical transistor and a method for forming the same, and more particularly, to a vertical transistor which can prevent a floating body effect and improve the characteristics of the vertical transistor and a method for forming the same.

In general, various manufacturing technologies are employed in a method for forming transistors and bit lines in a semiconductor device. These days, a MOSFET (metal oxide semiconductor field effect transistor) for producing a field effect by forming an oxide layer on a semiconductor substrate has been highlighted in the art.

In the MOSFET, processes are adopted to form transistors in the regions of the semiconductor substrate which are divided into a cell region and a peripheral circuit region. The transistors are formed by depositing a gate insulation layer and a gate conductive layer on the semiconductor substrate. The gate conductive layer is usually made of a polysilicon layer or the stack of a polysilicon layer and a metal-based layer.

Meanwhile, as the design rule of a semiconductor device decreases, the recent semiconductor industry trends toward increasing the integration level, the operation speed and the yield of a semiconductor device. In conformity with this trend, in order to overcome the limitations of a conventional transistor, regarding the integration level and the current performance of a semiconductor device, a vertical transistor has been suggested.

Differently from a conventional vertical transistor composed of a gate and source and drain regions which are formed in a semiconductor substrate on both sides of the gate so that a horizontal channel is defined, the vertical transistor is composed of a gate and source and drain regions which are formed over and under the gate so that a vertical channel is defined.

The channel of the vertical transistor is electrically connected with the semiconductor substrate through a portion of the semiconductor substrate which is positioned between the source regions. Through this, a body voltage can be applied to the vertical transistor.

However, in the conventional vertical transistor described above, as the design rule of a semiconductor device decreases, the interval between the neighboring source regions also decreases. Due to the decrease in the interval between the neighboring source regions, the impurities of the source regions may diffuse so that the interval between the source regions vanishes.

If the interval between the source regions vanishes, the body voltage applied from the semiconductor substrate may not be transmitted to the channel of the vertical transistor. Due to this fact, as the body of the vertical transistor for storing charges is floated, various problems are caused.

Concretely speaking, the electrical path between the vertical transistor and the semiconductor substrate is blocked by the presence of the source regions, and therefore, body bias cannot be applied to the channel of the vertical transistor. As a result, since the charges accumulated in the body of the vertical transistor cannot be discharged to the semiconductor substrate, the floating body effect is caused.

The floating body effects indicates a phenomenon that gate induced drain leakage (GIDL) or hot carrier injection occurs in an NMOS transistor, holes are trapped in the channel, and the threshold voltage of the transistor decreases due to the presence of the holes.

Therefore, in the conventional art, it is difficult to properly control the transistor due to the floating body effect, as a result of which the characteristics of the transistor are likely to be degraded.

SUMMARY OF THE INVENTION

Embodiments of the present invention are directed to a vertical transistor which can prevent a floating body effect and a method for forming the same.

Also, embodiments of the present invention are directed to a vertical transistor which can improve the characteristics thereof and a method for forming the same.

In one aspect, a vertical transistor comprises a semiconductor substrate having pillar type active patterns formed on a surface thereof; first junction regions formed in the surface of the semiconductor substrate on both sides of the active patterns; screening layers formed on sidewalls of the first junction regions; second junction regions formed on upper surfaces of the active patterns; and gates formed on sidewalls of the active patterns including the second junction regions to overlap with at least portions of the first junction regions.

The first and second junction regions comprise N-type ion-implantation layers.

The first junction regions are source regions, and the second junction regions are drain regions.

The first junction regions are drain regions, and the second junction regions are source regions.

The screening layers comprise an insulation layer.

The insulation layer includes a silicon oxide layer.

The first junction regions including the screening layers are located at an interval that corresponds to $\frac{1}{5} \sim \frac{1}{3}$ of a width of the active patterns.

The screening layers have a thickness that corresponds to $\frac{1}{6} \sim \frac{1}{4}$ of the width of the active patterns.

In another embodiment, a method for forming a vertical transistor comprises the steps of etching a semiconductor substrate and thereby defining grooves; forming screening layers on sidewalls of the grooves; forming a first epitaxial layer to fill the grooves; forming pillar type active patterns which is made of a second epitaxial layer, on the screening layers and portions of the semiconductor substrate which are positioned between portions of the first epitaxial layer; forming first junction regions and second junction regions in the first epitaxial layer and upper surfaces of the active patterns, respectively; and forming gates on sidewalls of the active patterns including the second junction regions, to overlap with at least portions of the first junction regions.

The step of defining grooves comprises the steps of etching anisotropically a semiconductor substrate; and etching isotropically etched portions of the semiconductor substrate to increase a width of the etched portions of the semiconductor substrate.

The step of forming screening layers comprises the steps of forming an insulation layer on the semiconductor substrate including surfaces of the grooves; and spacer etching the insulation layer such that the insulation layer remains only on sidewalls of the grooves.

The insulation layer comprises a silicon oxide layer.

The screening layers are formed to have a thickness that corresponds to 1/6~1/4 of a width of the active patterns.

The step of forming a first epitaxial layer comprises the steps of growing a first epitaxial layer on the semiconductor substrate including the screening layers, to a thickness that completely fills the grooves; and removing a surface of the first epitaxial layer to expose the semiconductor substrate.

The step of forming active patterns comprises the steps of growing a second epitaxial layer on the semiconductor substrate including the first epitaxial layer to cover the screening layers; and etching the second epitaxial layer such that the second epitaxial layer remains only on the screening layers and portions of the semiconductor substrate which are positioned between portions of the first epitaxial layer.

After the step of growing the second epitaxial layer, the method further comprises the step of planarizing a surface of the second epitaxial layer.

The first and second junction regions are formed by ion-implanting N-type impurities.

The first junction regions are source regions, and the second junction regions are drain regions.

The first junction regions are drain regions, and the second junction regions are source regions.

The first junction regions including the screening layers are formed to be located at an interval that corresponds to 1/5~1/3 of the width of the active patterns.

In still another aspect, a method for forming a vertical transistor, comprising the steps of etching a semiconductor substrate and thereby defining grooves; forming screening layers on sidewalls of the grooves; growing a first epitaxial layer doped with impurities in the grooves and thereby forming first junction regions; forming pillar type active patterns which is made of a second epitaxial layer, on the screening layers and portions of the semiconductor substrate which are positioned between the first junction regions, to partially overlap with the first junction regions; forming second junction regions in upper surfaces of the active patterns; and forming gates on sidewalls of the active patterns including the second junction regions, to overlap with at least portions of the first junction regions.

The step of defining grooves comprises the steps of etching anisotropically a semiconductor substrate; and etching isotropically etched portions of the semiconductor substrate to increase a width of the etched portions of the semiconductor substrate.

The step of forming screening layers comprises the steps of forming an insulation layer on the semiconductor substrate including surfaces of the grooves; and spacer etching the insulation layer such that the insulation layer remains only on sidewalls of the grooves.

The insulation layer comprises a silicon oxide layer.

The screening layers are formed to have a thickness that corresponds to 1/6~1/4 of a width of the active patterns.

The step of forming first junction regions comprises the steps of growing an N-type first epitaxial layer on the semiconductor substrate including the screening layers, to a thickness that completely fills the grooves; and removing a surface of the grown N-type first epitaxial layer to expose the semiconductor substrate.

The first junction regions including the screening layers are formed to be located at an interval that corresponds to 1/5~1/3 of the width of the active patterns.

The step of forming active patterns comprises the steps of growing a second epitaxial layer on the semiconductor substrate including the first junction regions to cover the screening layers; and etching the second epitaxial layer such that the second epitaxial layer remains only on the screening layers and portions of the semiconductor substrate which are positioned between the first junction regions.

After the step of growing the second epitaxial layer, the method further comprises the step of planarizing a surface of the second epitaxial layer.

The first and second junction regions are formed by ion-implanting N-type impurities.

The first junction regions are source regions, and the second junction regions are drain regions.

The first junction regions are drain regions, and the second junction regions are source regions.

DESCRIPTION OF SPECIFIC EMBODIMENTS

In the present invention, after forming screening layers on the sidewalls of a groove defined in a semiconductor substrate, a junction region, of which sidewalls are covered by the screening layers, is formed in the groove. Then, a pillar type active pattern is formed on the surface of the semiconductor substrate, and a gate is formed on the sidewalls of the active pattern to overlap at least partially with neighboring junction regions.

By this fact, the screening layers can prevent the impurities of the junction regions from diffusing to decrease or vanish the interval measured between neighboring junction regions. Through this, in the present invention, a body voltage can be stably supplied to the channel region of a vertical transistor.

Accordingly, in the present invention, it is possible to prevent occurrence of a floating body effect in which the body of the vertical transistor is floated and the charges accumulated in the channel region cannot be discharged to the semiconductor substrate, whereby the characteristics of the vertical transistor can be effectively improved.

Hereafter, specific embodiments of the present invention will be described with reference to the attached drawings.

Figure 1:
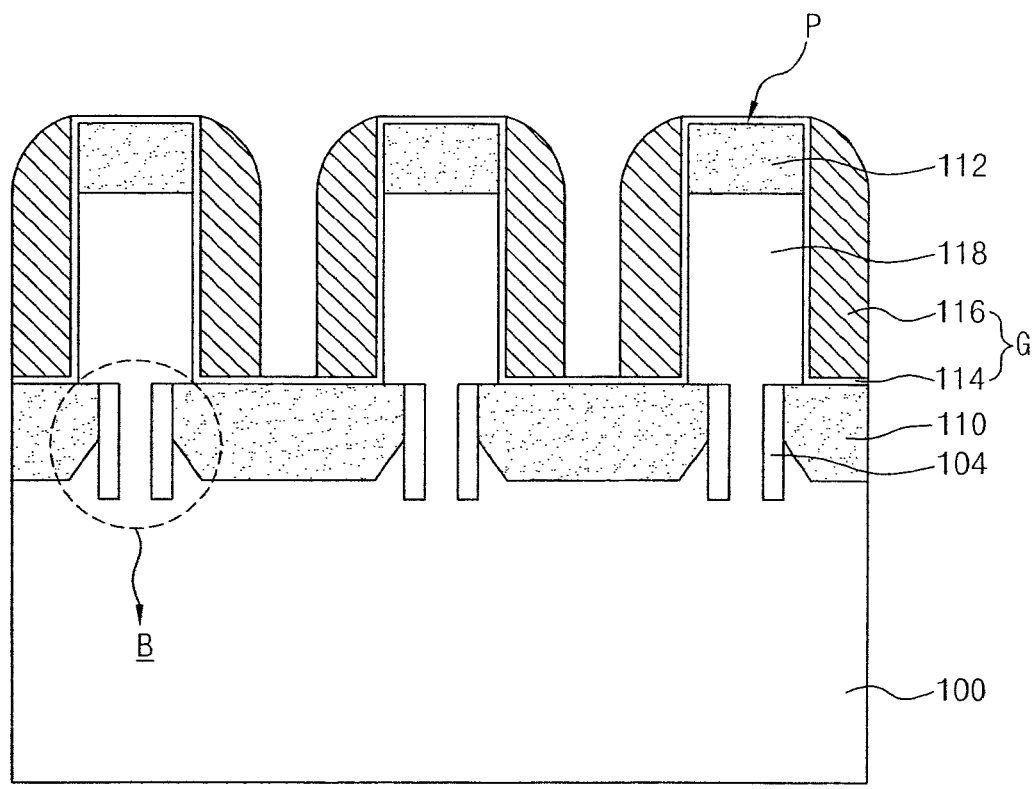
FIG. 1 is a cross-sectional view illustrating a vertical transistor in accordance with an embodiment of the present invention.

FIG. 1 is a cross-sectional view illustrating a vertical transistor in accordance with an embodiment of the present invention.

Referring to FIG. 1, pillar type active patterns P are formed on the surface of a semiconductor substrate 100. Source regions 110 are formed on the surface of the semiconductor substrate 100 on both sides of the active patterns P, and drain regions 112 are formed on the upper surfaces of the active patterns P. The source regions 110 and the drain regions 112 are made of N-type ion implantation layers. It can be contemplated that the source regions 110 are formed on the upper surfaces of the active patterns P and the drain regions 112 are formed on the surface of the semiconductor substrate 100 on both sides of the active patterns P.

Gates G are formed on the sidewalls of the active patterns P including the drain regions 112 to come into contact with the source regions 110, preferably, to partially overlap with the source regions 110. The gates G include a gate insulation layer 114 and a gate conductive layer 116. Therefore, according to the present invention, vertical transistors having vertically extending channel regions 118, which are formed in the active patterns P between the source regions 110 and the drain regions 112, are formed.

Screening layers 104 made of an insulation layer, preferably, a silicon oxide layer, are formed on the sidewalls of the respective source regions 110. The screening layers 104 have a thickness that is no greater than ¼ of the width of the active patterns P, for example, corresponds to ⅙~¼ of the width of the active patterns P. According to this, the source regions 110, which are covered by the screening layers 104 on the sidewalls thereof, can be separated by an interval that is no greater than ⅓ of or, for example, corresponds to ⅕~⅓ of the width of the active patterns P.

In the present invention, due to the fact that the screening layers 104 are formed on the sidewalls of the respective source regions 110, it is possible to prevent the impurities of the source regions 110 from diffusing thorough the sidewalls of the source regions 110. As a consequence, in the present invention, it is possible to prevent the interval between the neighboring source regions 100 from decreasing or vanishing due to the diffusion of the impurities of the source regions 110. Therefore, it is also possible to prevent the electrical paths between the channel regions 118 of the vertical transistors and the semiconductor substrate 100 from being blocked by the source regions 110.

Hence, in the present invention, paths B, through which the charges accumulated in the channel regions 118 of the vertical transistors can be discharged to the semiconductor substrate 100, can be secured by the presence of the screening layers 104. Through this, a floating body effect can be prevented, and the characteristics of the transistors can be improved.

FIGS. 2A through 2H are cross-sectional views illustrating the processes of a method for forming a vertical transistor in accordance with another embodiment of the present invention.

Figure 2A:
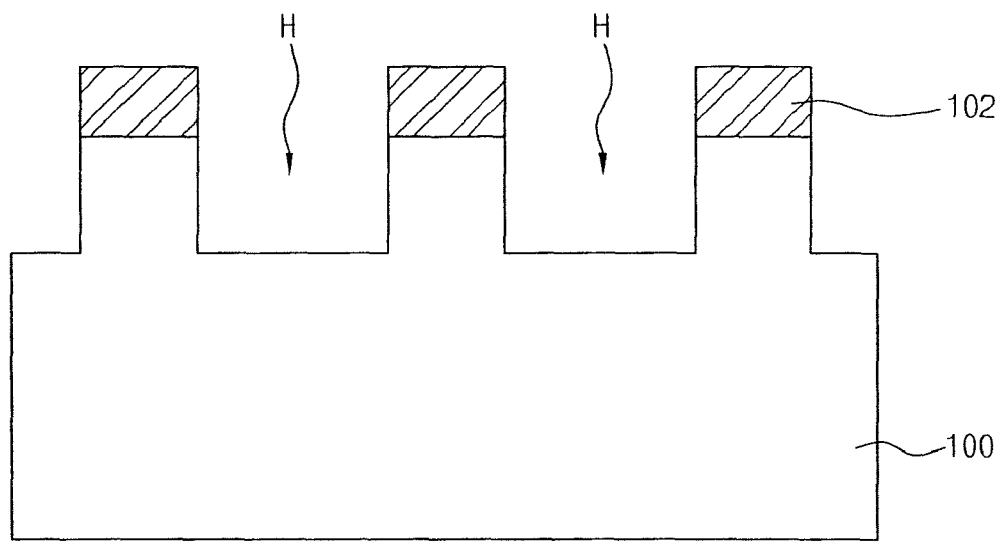
FIGS. 2A through 2H are cross-sectional views illustrating the processes of a method for forming a vertical transistor in accordance with another embodiment of the present invention.

Referring to FIG. 2A, after forming a hard mask layer 102 on a semiconductor substrate 100, a photoresist pattern (not shown) is formed on the hard mask layer 102. The hard mask layer 102 is, for example, made of a silicon nitride layer, and the photoresist pattern is formed to expose partial areas of the hard mask layer 102. By anisotropically etching portions of the hard mask layer 102, which are exposed by the photoresist pattern, and a predetermined thickness of portions of the semiconductor substrate 100, which are placed thereunder through a well-known photo process, grooves H are defined. Thereafter, the photoresist pattern is removed.

Figure 2B:
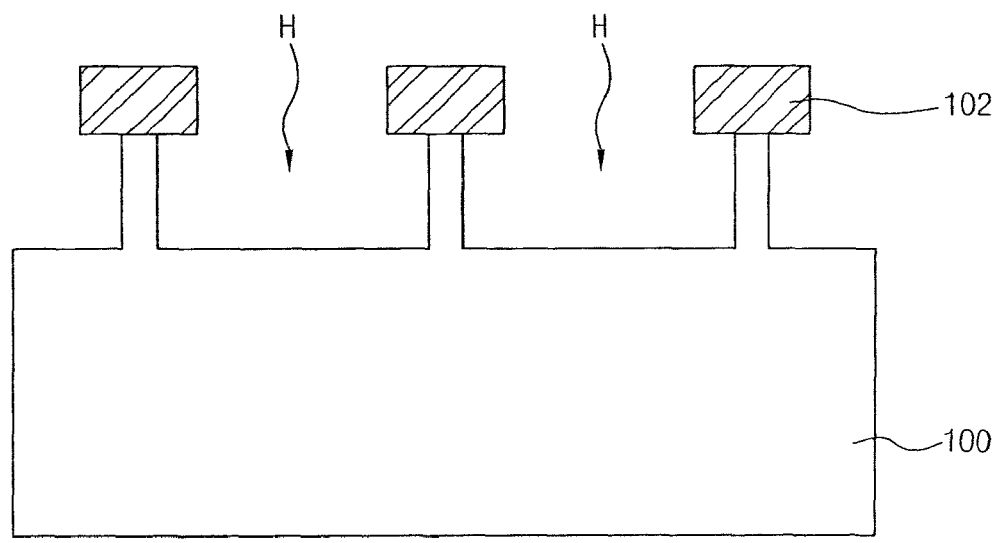

Referring to FIG. 2B, the sidewalls of the grooves H are isotropically etched such that the width of the grooves H is increased.

Figure 2C:
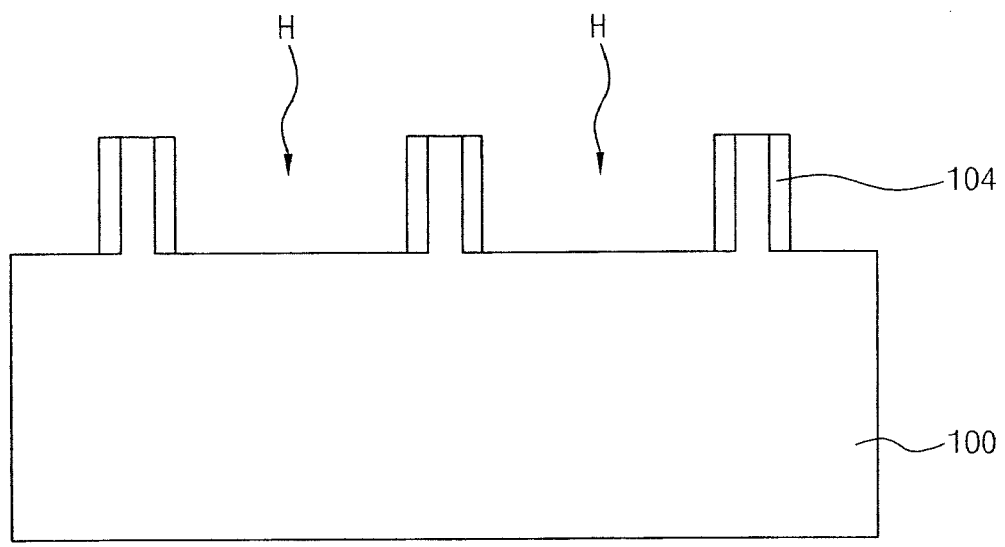

Referring to FIG. 2C, with the hard mask layer 102 removed, an insulation layer, preferably, a silicon oxide layer is deposited on the semiconductor substrate 100 including the surfaces of the grooves H. Then, by spacer etching the insulation layer such that the insulation layer remains only on the sidewalls of the grooves H, screening layers 104 are formed on the sidewalls of the grooves H. The screening layers 104 are formed to have a thickness that is no greater than ¼ of or, preferably, corresponds to ⅙~¼ of the width of active patterns P to be subsequently formed.

Figure 2D:
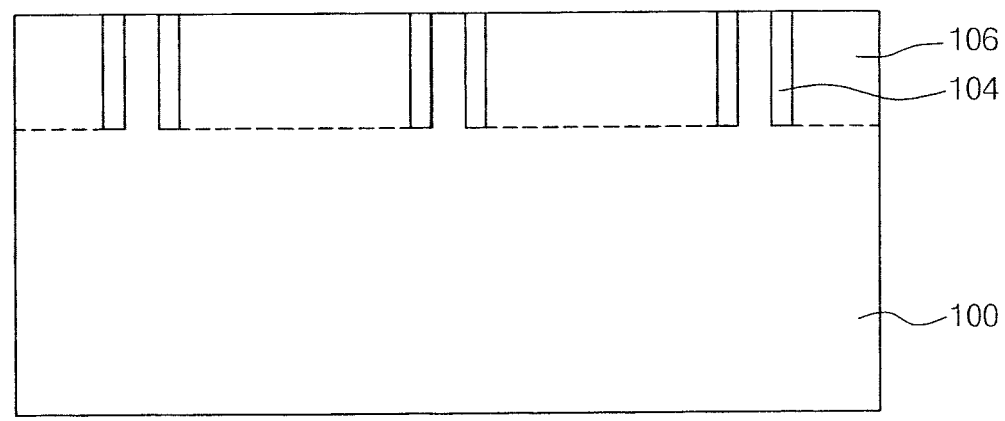

Referring to FIG. 2D, a first epitaxial layer 106 is grown on the semiconductor substrate 100 starting from portions of the bottom surfaces of the grooves H, on which the screening layers 104 are not formed, to a thickness that completely fills the grooves H. Thereupon, the surface of the first epitaxial layer 106 grown in this way is removed through a CMP (chemical mechanical polishing) process or an etch back process to expose the semiconductor substrate 100.

Figure 2E:
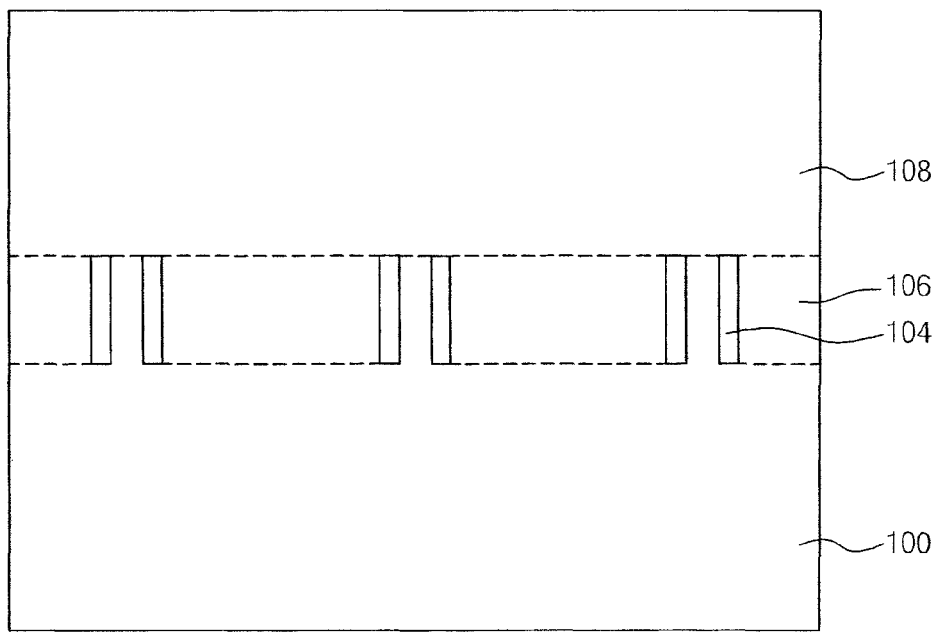

Referring to FIG. 2E, a second epitaxial layer 108 is formed on the first epitaxial layer 106, the screening layers 104 and the semiconductor substrate 100. The second epitaxial layer 108 is formed to have a thickness that corresponds to a channel length desired in the structure of a vertical transistor. In succession, the surface of the second epitaxial layer 108 is planarized through a CMP process or an etch back process.

Figure 2F:
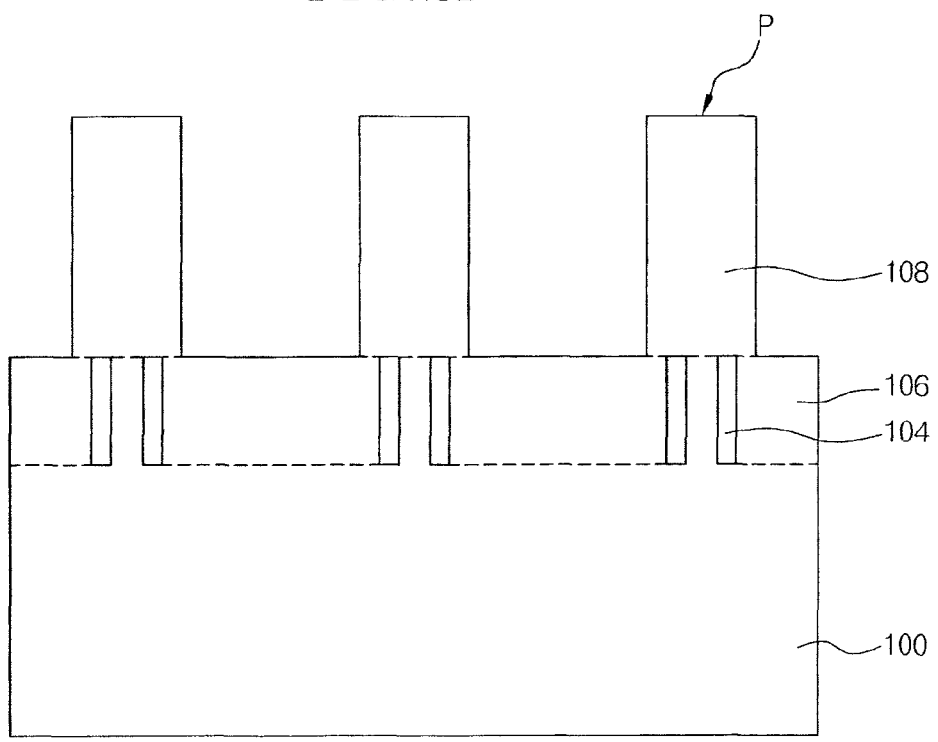

Referring to FIG. 2F, by etching the second epitaxial layer 108, pillar type active patterns P are formed on the screening layers 104 and portions of the semiconductor substrate 100 which are positioned between portions of the first epitaxial layer 106, to partially overlap with the first epitaxial layer 106. At this time, it is preferred that etching be implemented not to cause an etch loss of the first epitaxial layer 106.

Figure 2G:
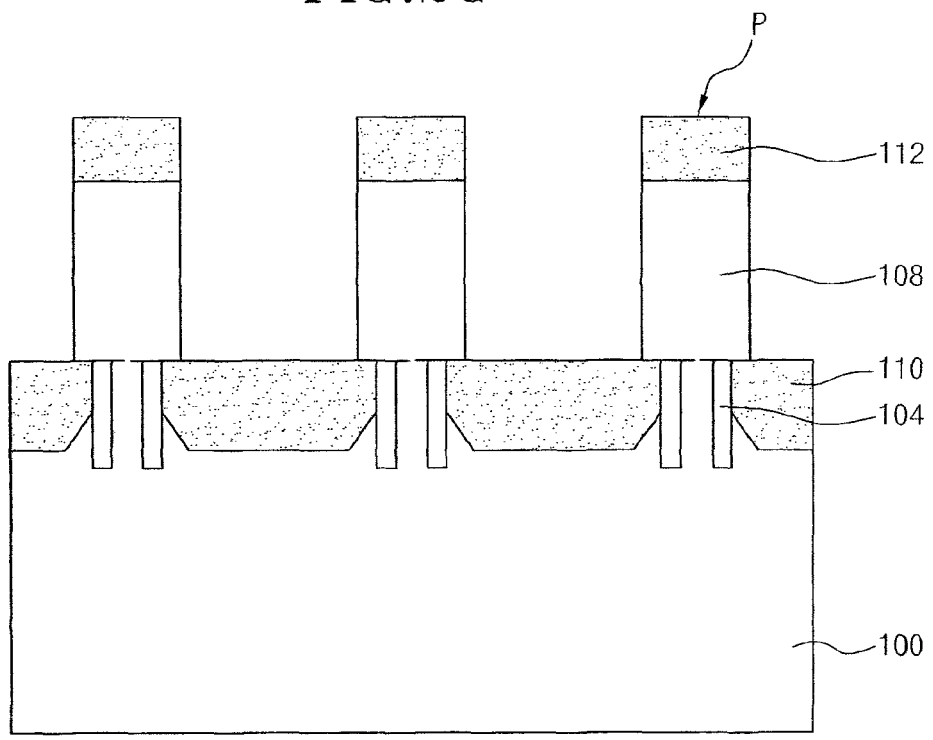

Referring to FIG. 2G, by implementing an N-type impurity ion-implantation process for the resultant semiconductor substrate 100 which is formed with the active patterns P, source regions 110 are formed in the first epitaxial layer 106 which is filled in the grooves H, and drain regions 112 are formed on the upper surfaces of the active patterns P. It can be contemplated that the source regions 110 are formed on the upper surfaces of the active patterns P and the drain regions 112 are formed in the first epitaxial layer 106 which is filled in the grooves H.

The source regions 110 are formed in the grooves H such that the sidewalls of the source regions 110 are covered by the screening layers 104. Accordingly, in the present invention, through the formation of the screening layers 104, it is possible to prevent the N-type impurities ion-implanted into the source regions 110 from diffusing through the sidewalls of the source regions 110. Through this, it is possible to prevent the interval between neighboring source regions 110 from decreasing or vanishing. According to this, the source regions 110 can be separated on the surface of the semiconductor substrate 100 by an interval that is no greater than ⅓ of or, preferably, corresponds to ⅕~⅓ of the width of the active patterns P.

Figure 2H:
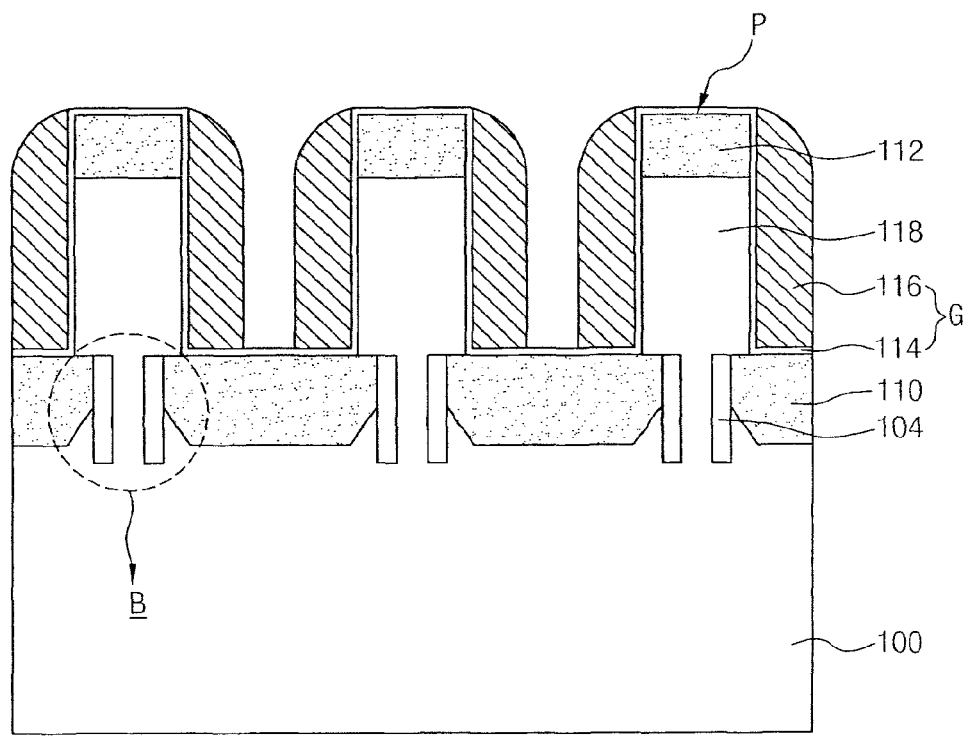

Referring to FIG. 2H, after forming a gate insulation layer 114 on the surface of the semiconductor substrate 100 which is formed with the source regions 110 and the drain regions 112, a gate conductive layer 116 is formed on the gate insulation layer 114. Next, by etching the gate conductive layer 116 and the gate insulation layer 114, gates G are formed on the sidewalls of the gate patterns P including the drain regions 112 to overlap with at least portions of the source regions 110.

As a result of this, vertical transistors having vertically extending channel regions 118, which are formed in the active patterns P between the source regions 110 and the drain regions 112, are formed. The channel regions 118 of the vertical transistors are electrically connected with the semiconductor substrate 100 by semiconductor substrate portions B between the screening layers 104. A body voltage can be applied to the vertical transistors through the semiconductor substrate portions B.

As described above, in the present invention, through the formation of the screening layers 104, it is possible to prevent impurities in the source regions 110 from diffusing through the sidewalls of the source regions 110. Therefore, it is possible to prevent the interval between neighboring source regions 110 from decreasing or vanishing. According to this, it is also possible to prevent the electrical paths between the vertical transistors and the semiconductor substrate 100 from being blocked.

As a consequence, in the present invention, since a body voltage can be stably supplied to the channel regions 118 of the vertical transistors through the semiconductor substrate portions B between the screening layers 104, it is possible to prevent a floating body effect from being induced due to floating of the bodies of the vertical transistors, and through this, the characteristics of the vertical transistors can be improved.

In the above embodiment of the present invention, it was described that, after forming the first and second epitaxial layers, the N-type impurity ion-implantation process is implemented to simultaneously form the source regions and the drain regions. However, in accordance with still another embodiment of the present invention, it can be envisaged that, after growing a first epitaxial layer having N-type impurities doped therein and thereby forming source regions, drain regions are formed later so that subsequent processes including the ion-implantation process can be stably implemented.

FIGS. 3A through 3G are cross-sectional views illustrating the processes of a method for forming a vertical transistor in accordance with still another embodiment of the present invention.

Figure 3A:
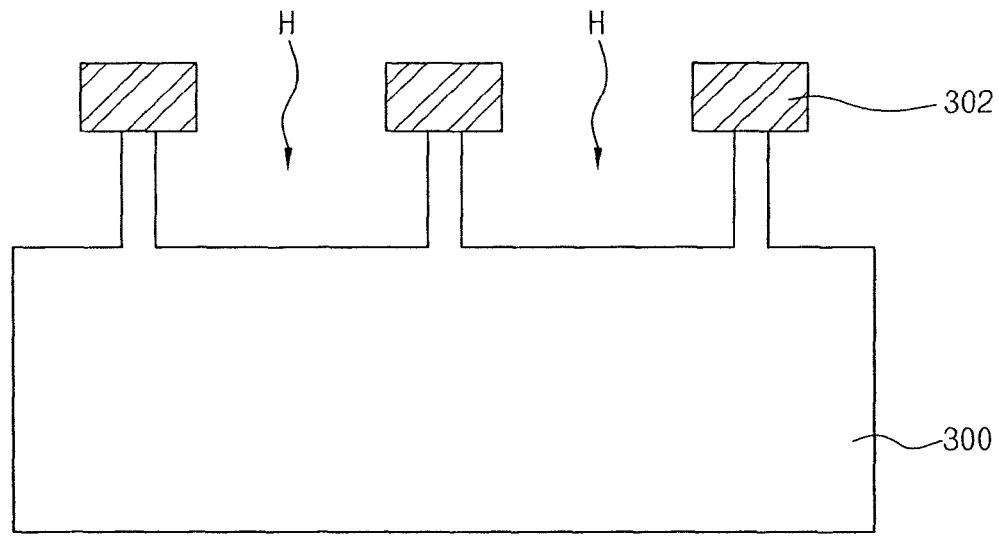
FIGS. 3A through 3G are cross-sectional views illustrating the processes of a method for forming a vertical transistor in accordance with still another embodiment of the present invention.

Referring to FIG. 3A, after forming a hard mask layer 302 on a semiconductor substrate 300, a photoresist pattern (not shown) is formed on the hard mask layer 302. The hard mask layer 302 is, for example, made of a silicon nitride layer, and the photoresist pattern is formed to expose partial areas of the hard mask layer 302. By anisotropically etching portions of the hard mask layer 302, which are exposed by the photoresist pattern, and a predetermined thickness of portions of the semiconductor substrate 300, which are placed thereunder, through a well-known photo process, grooves H are defined. After removing the photoresist pattern, the sidewalls of the grooves H are isotropically etched such that the width of the grooves H is increased.

Figure 3B:
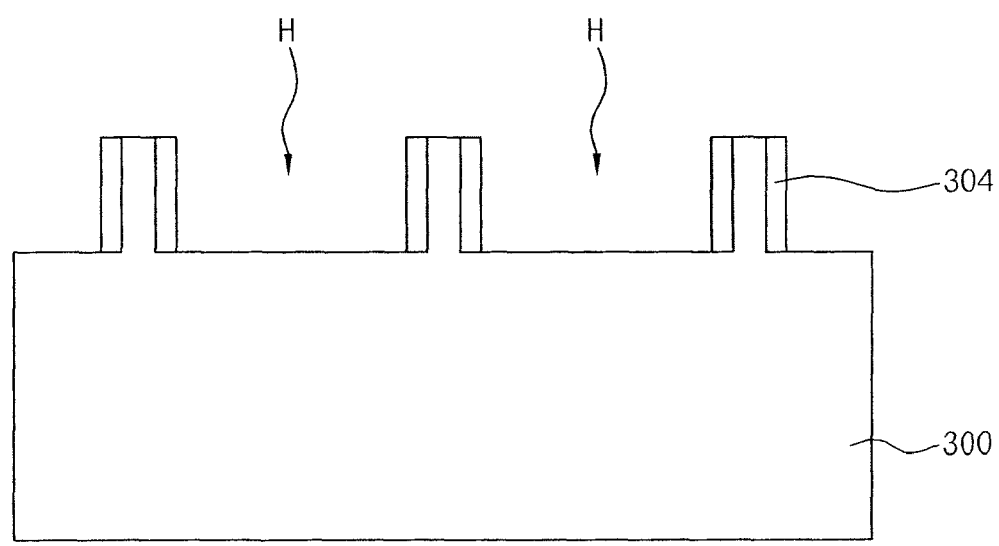

Referring to FIG. 3B, with the hard mask layer 302 removed, an insulation layer, preferably, a silicon oxide layer is deposited on the semiconductor substrate 300 including the surfaces of the grooves H. Then, by spacer etching the insulation layer, screening layers 304 are formed on the sidewalls of the grooves H. The screening layers 304 are formed to have a thickness that is no greater than ¼ of or, preferably, corresponds to ⅙~¼ of the width of active patterns P to be subsequently formed.

Figure 3C:
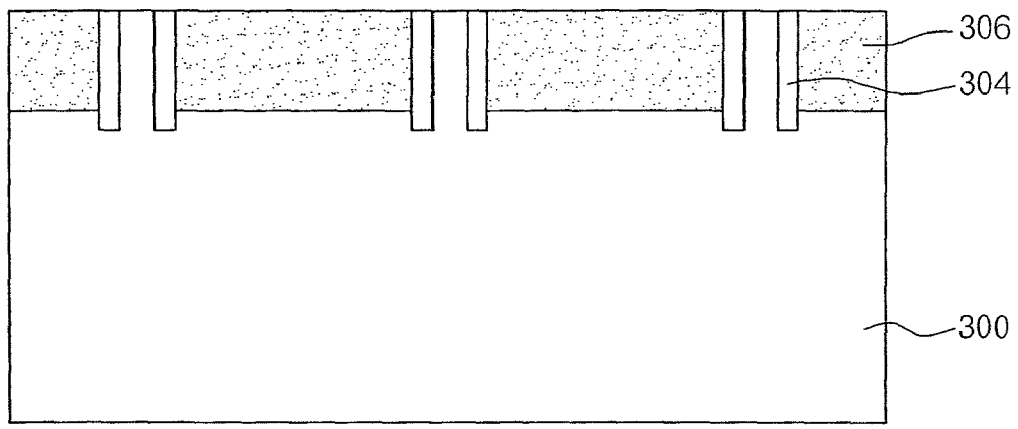

Referring to FIG. 3C, a first epitaxial layer doped with N-type impurities is grown on the semiconductor substrate 300 starting from portions of the bottom surfaces of the grooves H, on which the screening layers 304 are not formed, to a thickness that completely fills the grooves H. Thereupon, the surface of the first epitaxial layer doped with the N-type impurities is removed through a CMP process or an etch back process to expose the semiconductor substrate 300, and thereby source regions 306 are formed in the respective grooves H. The source regions 306 are formed in the grooves H such that the sidewalls of the source regions 306 are covered by the screening layers 304. Through this, the source regions 306 can be separated on the surface of the semiconductor substrate 300 by an interval that is no greater than ⅓ of or, preferably, corresponds to ⅕~⅓ of the width of the active patterns P to be subsequently formed.

Here, in this embodiment of the present invention, due to the fact that the first epitaxial layer is grown in a state in which it is doped with the N-type impurities, the source regions 306 can be formed prior to forming the active patterns P. Through this, subsequent processes including an ion-implantation process for forming drain regions can be stably implemented.

Figure 3D:
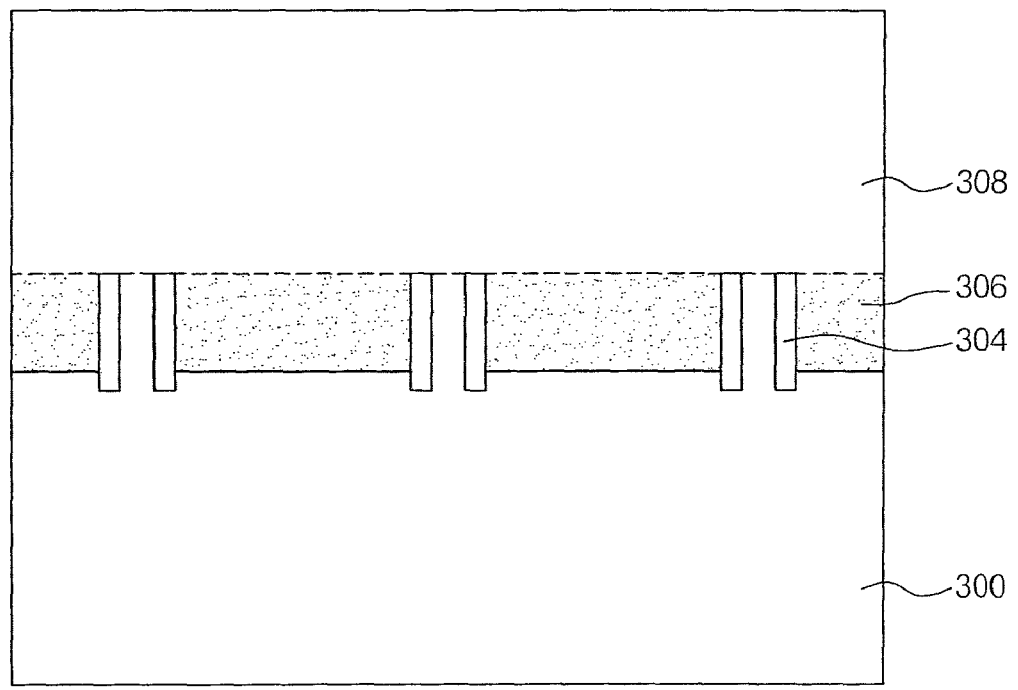

Referring to FIG. 3D, a second epitaxial layer 308 is formed on the source regions 306, the screening layers 304 and the semiconductor substrate 300. The second epitaxial layer 308 is formed to have a thickness that corresponds to a channel length desired in the structure of a vertical transistor. In succession, the surface of the second epitaxial layer 308 is planarized through a CMP process or an etch back process.

Figure 3E:
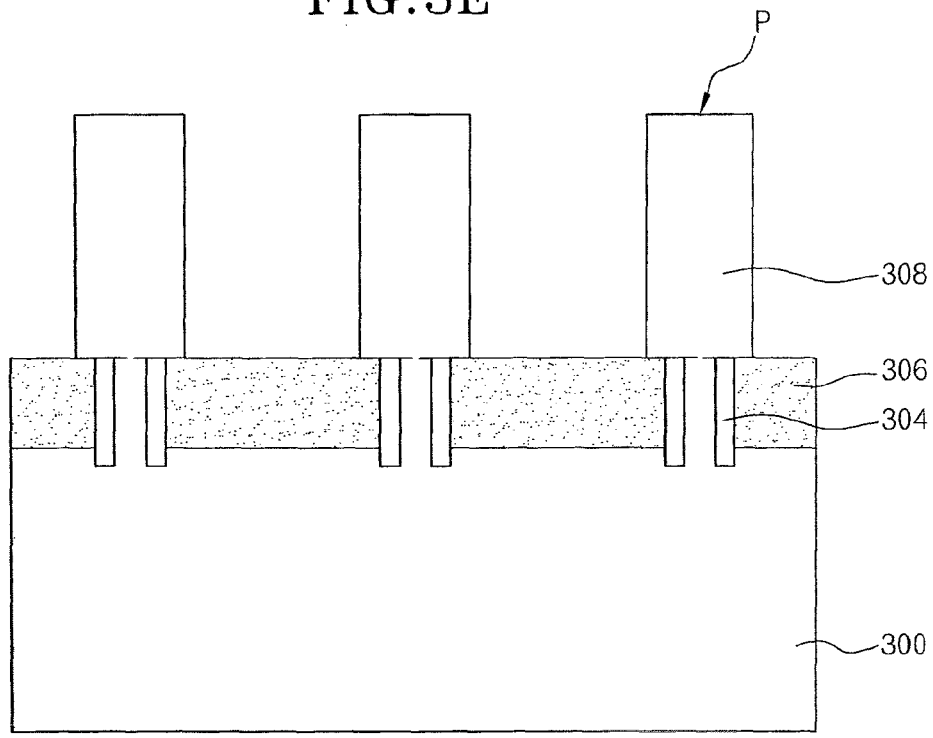

Referring to FIG. 3E, by etching the second epitaxial layer 308, pillar type active patterns P are formed on the screening layers 304 and portions of the semiconductor substrate 300 which are positioned between portions of the source regions 306, to partially overlap with the source regions 306. At this time, it is preferred that etching be implemented not to cause an etch loss of the source regions 306.

Figure 3F:
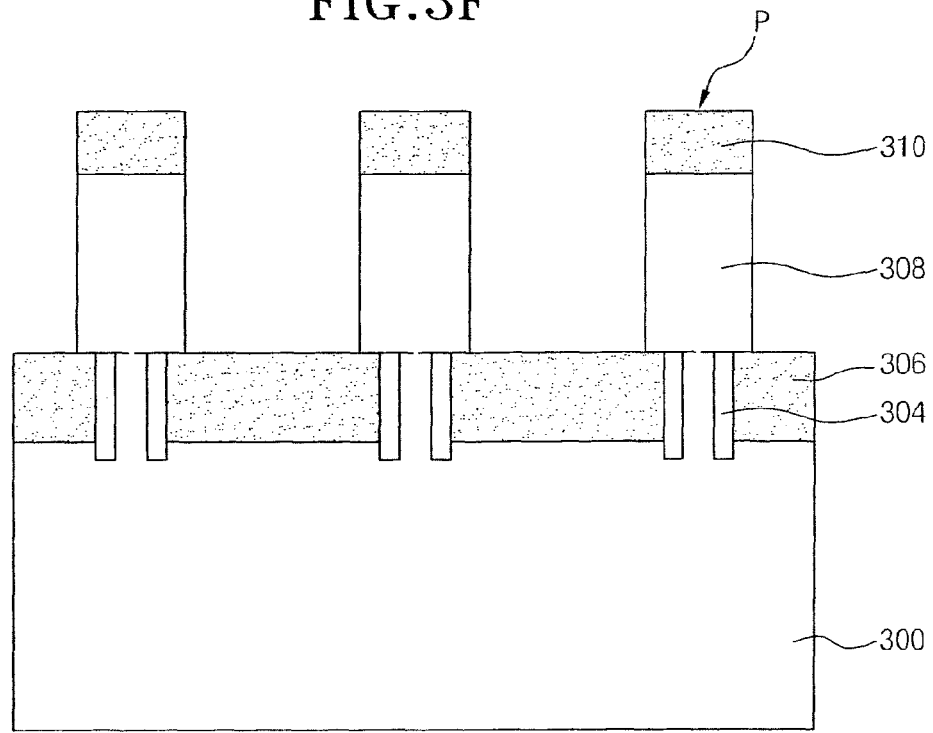

Referring to FIG. 3F, by implementing an N-type impurity ion-implantation process for the resultant semiconductor substrate 300 which is formed with the active patterns P, drain regions 310 are formed on the upper surfaces of the active patterns P. The positions of the source regions 306 and the drain regions 310 may be changed with each other.

Figure 3G:
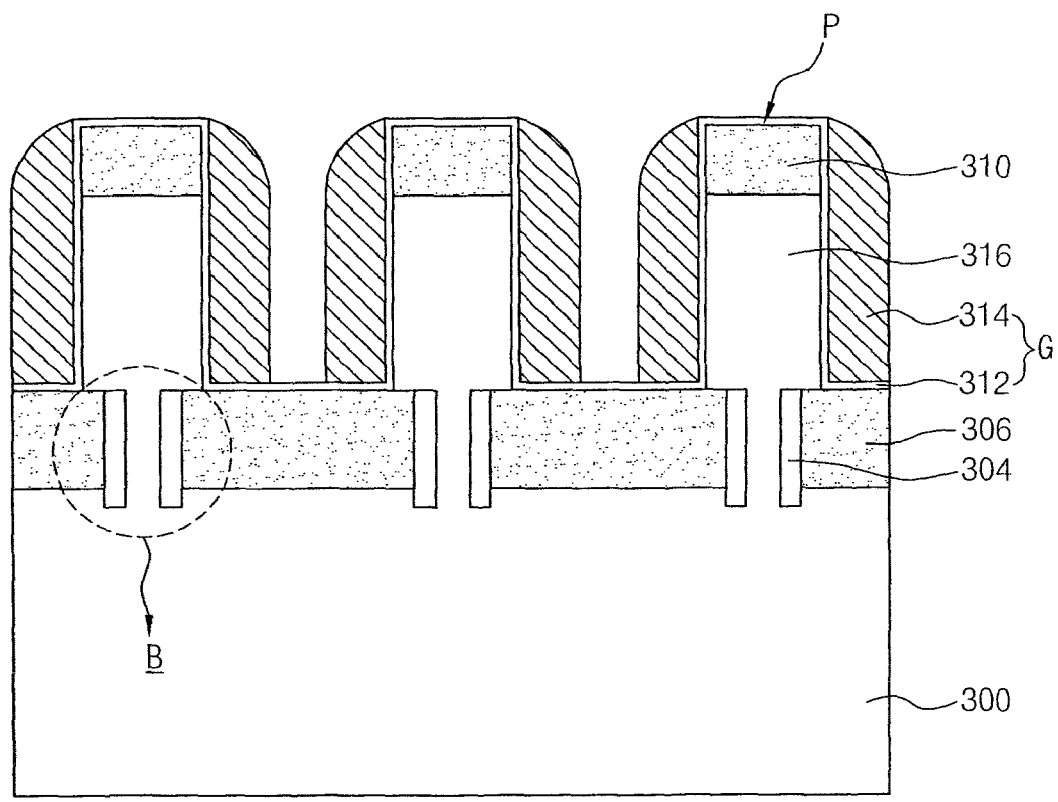

Referring to FIG. 3G, after forming a gate insulation layer 312 on the surface of the semiconductor substrate 300 which is formed with the drain regions 310, a gate conductive layer 314 is formed on the gate insulation layer 312. Next, by etching the gate conductive layer 314 and the gate insulation layer 312, gates G are formed on the sidewalls of the gate patterns P including the drain regions 310 to overlap with at least portions of the source regions 306.

As a result of this, vertical transistors having vertically extending channel regions 316, which are formed in the active patterns P between the source regions 306 and the drain regions 310, are formed. The channel regions 316 of the vertical transistors are electrically connected with the semiconductor substrate 300 by semiconductor substrate portions B between the screening layers 304. A body voltage can be applied to the vertical transistors through the semiconductor substrate portions B.

As described above, in the present embodiment of the invention, through the formation of the screening layers 304, it is possible to prevent the interval between neighboring source regions 306 from decreasing or vanishing. According to this, since a body voltage can be stably supplied to the channel regions 316 of the vertical transistors, it is possible to prevent a floating body effect from being induced.

Although specific embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for forming a vertical transistor, comprising the steps of:
    etching a semiconductor substrate and thereby defining grooves;
    forming screening layers on sidewalls of the grooves;
    forming a first epitaxial layer to fill the grooves;
    forming pillar type active patterns which are made of a second epitaxial layer, on the screening layers and portions of the semiconductor substrate which are positioned between portions of the first epitaxial layer;
    forming first junction regions and second junction regions in the first epitaxial layer and upper surfaces of the active patterns, respectively; and
    forming gates on sidewalls of the active patterns including the second junction region, to overlap with at least portions of the first junction regions.

2. The method according to claim 1, wherein the step of defining grooves comprises the steps of:
- etching anisotropically a semiconductor substrate; and
- etching isotropically etched portions of the semiconductor substrate to increase a width of the etched portions of the semiconductor substrate.

3. The method according to claim 1, wherein the step of forming screening layers comprises the steps of:
- forming an insulation layer on the semiconductor substrate including surfaces of the grooves; and
- spacer etching the insulation layer such that the insulation layer remains only on sidewalls of the grooves.

4. The method according to claim 3, wherein the insulation layer comprises a silicon oxide layer.

5. The method according to claim 1, wherein the screening layers are formed to have a thickness that corresponds to $1/6 \sim 1/4$ of a width of the active patterns.

6. The method according to claim 1, wherein the step of forming a first epitaxial layer comprises the steps of:
- growing a first epitaxial layer on the semiconductor substrate including the screening layers, to a thickness that completely fills the grooves; and
- removing a surface of the first epitaxial layer to expose the semiconductor substrate.

7. The method according to claim 1, wherein the step of forming active patterns comprises the steps of:
- growing a second epitaxial layer on the semiconductor substrate including the first epitaxial layer to cover the screening layers; and
- etching the second epitaxial layer such that the second epitaxial layer remains only on the screening layers and portions of the semiconductor substrate which are positioned between portions of the first epitaxial layer.

8. The method according to claim 7, wherein, after the step of growing the second epitaxial layer, the method further comprises the step of:
- planarizing a surface of the second epitaxial layer.

9. The method according to claim 1, wherein the first junction regions including the screening layers are formed to be located at an interval that corresponds to $1/5 \sim 1/3$ of the width of the active patterns.

10. A method for forming a vertical transistor, comprising the steps of:
- etching a semiconductor substrate and thereby defining grooves;
- forming screening layers on sidewalls of the grooves;
- growing a first epitaxial layer doped with impurities in the grooves and thereby forming first junction regions;
- forming pillar type active patterns which are made of a second epitaxial layer, on the screening layers and portions of the semiconductor substrate which are positioned between the first junction regions, to partially overlap with the first junction regions;
- forming second junction regions in upper surfaces of the active patterns; and
- forming gates on sidewalls of the active patterns including the second junction regions, to overlap with at least portions of the first junction regions.

11. The method according to claim 10, wherein the step of defining grooves comprises the steps of:
- etching anisotropically a semiconductor substrate; and
- etching isotropically etched portions of the semiconductor substrate to increase a width of the etched portions of the semiconductor substrate.

12. The method according to claim 10, wherein the step of forming screening layers comprises the steps of:
- forming an insulation layer on the semiconductor substrate including surfaces of the grooves; and
- spacer etching the insulation layer such that the insulation layer remains only on sidewalls of the grooves.

13. The method according to claim 12, wherein the insulation layer comprises a silicon oxide layer.

14. The method according to claim 10, wherein the screening layers are formed to have a thickness that corresponds to $1/6 \sim 1/4$ of a width of the active patterns.

15. The method according to claim 10, wherein the step of forming first junction regions comprises the steps of:
- growing an N-type first epitaxial layer on the semiconductor substrate including the screening layers, to a thickness that completely fills the grooves; and
- removing a surface of the grown N-type first epitaxial layer to expose the semiconductor substrate.

16. The method according to claim 10, wherein the first junction regions including the screening layers are formed to be located at an interval that corresponds to $1/5 \sim 1/3$ of the width of the active patterns.

17. The method according to claim 10, wherein the step of forming active patterns comprises the steps of:
- growing a second epitaxial layer on the semiconductor substrate including the first junction regions to cover the screening layers; and
- etching the second epitaxial layer such that the second epitaxial layer remains only on the screening layers and portions of the semiconductor substrate which are positioned between the first junction regions.

18. The method according to claim 17, wherein, after the step of growing the second epitaxial layer, the method further comprises the step of:
- planarizing a surface of the second epitaxial layer.

* * * * *